US006242329B1

(12) United States Patent
Huster et al.

(10) Patent No.: US 6,242,329 B1
(45) Date of Patent: *Jun. 5, 2001

(54) METHOD FOR MANUFACTURING ASYMMETRIC CHANNEL TRANSISTOR

(75) Inventors: Carl Robert Huster, Sunnyvale; Concetta Riccobene, Mountain View; Richard Rouse, San Francisco; Donald L. Wollesen, Saratoga, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/243,875

(22) Filed: Feb. 3, 1999

(51) Int. Cl.[7] .................................................. H01L 21/425

(52) U.S. Cl. ........................................... 438/531; 435/302

(58) Field of Search .................................... 438/525, 531, 438/305, 302, 303, 290, 163, 307, 306

(56) References Cited

U.S. PATENT DOCUMENTS

| | | | | |
|---|---|---|---|---|
| 5,258,319 | * | 11/1993 | Inuishi et al. | 437/35 |
| 5,308,780 | * | 5/1994 | Chou et al. | 437/44 |
| 5,429,960 | * | 7/1995 | Hong | 437/35 |
| 5,510,279 | * | 4/1996 | Chien et al. | 437/41 |
| 5,518,942 | * | 5/1996 | Shrivastava | 437/43 |
| 5,935,867 | * | 8/1999 | Alvis et al. | 437/35 |
| 5,960,291 | * | 9/1999 | Krivokapic | 438/286 |
| 6,030,871 | * | 2/2000 | Eitan | 438/276 |
| 6,040,208 | * | 3/2000 | Honeycutt et al. | 438/229 |
| 6,130,134 | * | 10/2000 | Chen | 438/302 |
| 6,140,186 | * | 10/2000 | Lin et al. | 438/286 |

OTHER PUBLICATIONS

Steiner et al., "Minimum–Size Effects in Asymmetric Tilt–Angle–Implanted LDD–WNx–GaAs Mesfet's". IEEE Transactions on Electron Devices. vol. 38. No. 8. Aug. 1991.*

S. M. Sze, Physics of Semiconductor Devices, Second Edition, published by John Wiley & Sons, pp. 489–90.

Odanaka et al., Potential Design and Transport Property of 0.1 μm MOSFET with Asymmetric Channel Profile; IEEE Transactions on Electron Devices, vol. 44, No. 4, Apr. 1997, pp. 595–600.

Ohzone et al., Influence of Asymmetric/Symmetric source/Drain Region on Asymmetry and Mismatch of CMOSFET's and Circuit Performance; IEEE Transactions on Electron Devices, vol. 45, No. 2, Feb. 1998, pp. 529–537.

* cited by examiner

*Primary Examiner*—Steven Loke
*Assistant Examiner*—Douglas W. Owens
(74) *Attorney, Agent, or Firm*—Brinks Hofer Gilson & Lione

(57) ABSTRACT

A method for manufacturing a field effect transistor (100) includes steps of forming a gate stack (102) on the surface (114) of a semiconductor substrate (108), and defining source/drain regions (104, 106) on either side of the gate stack and a channel region (130) under the gate stack. The channel region has one end (132) proximate a first source/drain region and another end (134) proximate a second source/drain region. The method further includes forming a masking layer (174) on the surface of the semiconductor substrate. The masking layer has a nominal alignment position and a misalignment tolerance. The method still further includes implanting doping ions in the semiconductor substrate to asymmetrically dope the field effect transistor, including selecting a tilt angle and a rotation angle (B, D, F, H) sufficient to ensure shadowing of one end of the channel region from implantation of the doping ions.

8 Claims, 4 Drawing Sheets

METHOD FOR MANUFACTURING ASYMMETRIC CHANNEL TRANSISTOR

FIELD OF THE INVENTION

The present invention relates generally to semiconductor devices. The present invention relates more particularly to a method for manufacturing field effect transistors having asymmetric channel doping profiles.

BACKGROUND OF THE INVENTION

Conventional field effect transistors have uniformly doped channel regions. Source/drain regions are implanted and diffused on either side of a polysilicon gate structure. A channel implant step adjusts the threshold voltage of the transistor and produces channel doping which is symmetrically distributed between the source and the drain. Generally, similar processing steps are followed for producing uniformly doped p-channel and n-channel transistors in complementary metal-oxide-semiconductor (CMOS) processes.

Symmetric channel doping has required a tradeoff between maximum drive current, $I_{Dsat}$, and leakage current, $I_{Doff}$. Channel doping is necessary to limit leakage current in the transistor. Leakage current is the current which flows from source to drain when zero gate to source bias is applied. Minimum leakage current is necessary to limit overall power dissipation in a large scale integrated circuit using many thousands of transistors. However, the channel doping required to limit or control leakage current has the deleterious effect of reducing drive current, which is the current available from the transistor to drive a load. Maximum drive current is necessary to maximize the speed of operation of circuits incorporating the transistor. The tradeoff between leakage current and drive current becomes more severe in deep-submicron transistors, i.e., those with gate lengths below 0.15 $\mu$m.

Recently, asymmetrical channel profiles have been proposed for deep-submicron field effect transistors. Such devices have features which make them advantageous for integrated circuit performance. In particular, asymmetric devices allow for increased drain current ($I_{Dsat}$), which in turn affords higher operational speeds. The asymmetrical channel is achieved by an ion implantation step. This implantation step may replace the implant for the symmetric channel doping or it may be used in addition to that implant.

However, this additional ion implantation step tends to increase manufacturing costs. Additional mask steps are required to define the ion implantation windows for each required transistor orientation. Each additional mask step increases cost and misalignment risk. Misalignment of the masks used for asymmetric channel implant can impair performance of the finished transistor. This is inconsistent with a goal of minimizing masking steps to minimize manufacturing costs.

Accordingly, there is a need for a method for manufacturing field effect transistors having asymmetrical channel profiles which minimizes additional masking steps and manufacturing costs.

SUMMARY

The invention provides a method for asymmetrically doping a field effect transistor. The method includes steps of forming a gate stack on a semiconductor substrate to define a channel region under the gate stack and first and second source/drain regions adjacent to the gate stack. The method further includes steps of masking one of the source/drain regions and implanting dopant at a predetermined tilt angle and rotation angle to dope a portion of the channel region proximate the first source/drain region, thereby asymmetrically doping the field effect transistor.

DETAILED DESCRIPTION OF THE PRESENTLY PREFERRED EMBODIMENTS

Figure 1:
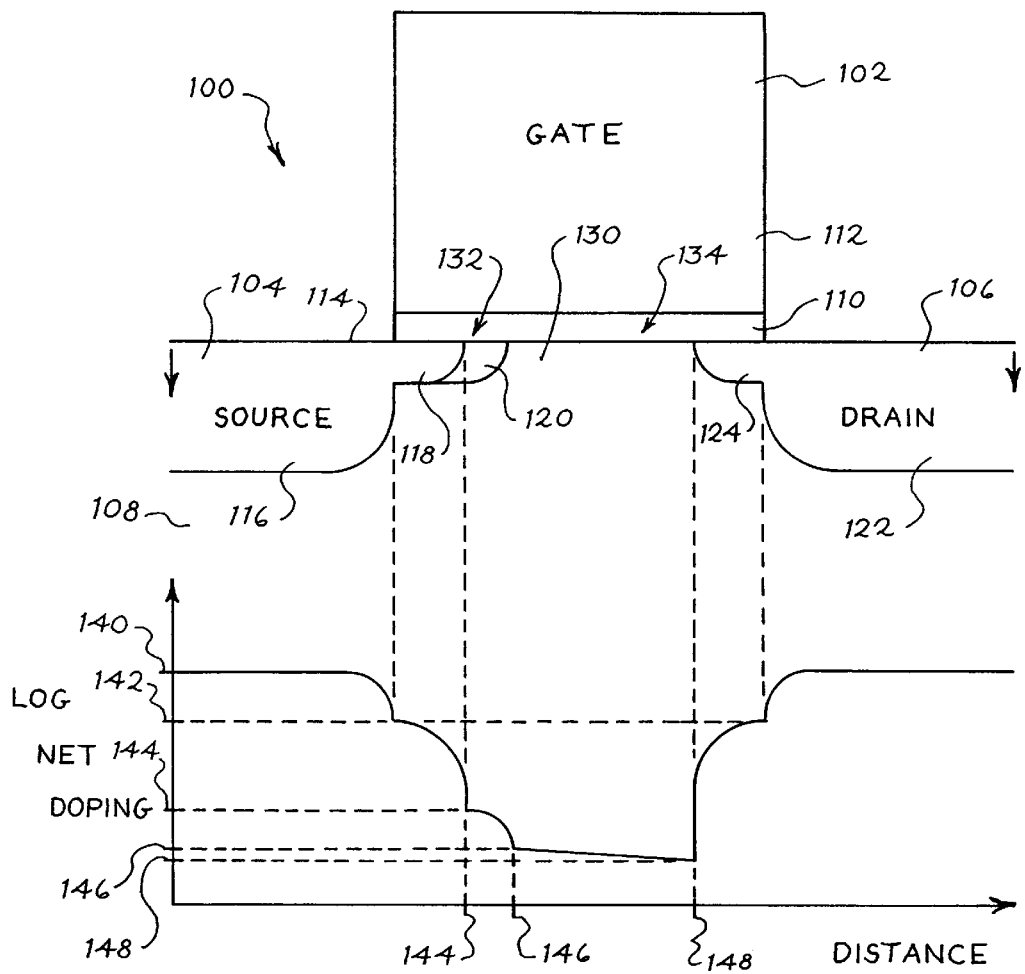
FIG. 1 is a cross sectional view of a transistor formed in a silicon substrate, and an associated plot of relative doping in the transistor.

Referring now to FIG. 1, it shows a cross-sectional view of a field effect transistor 100 in accordance with the present invention. FIG. 1 also shows a plot of relative doping levels in the field effect transistor 100.

The field effect transistor 100 includes a gate stack 102 and a source region 104 and drain region 106 formed in a semiconductor substrate 108. The semiconductor substrate 108 may be a portion of a semiconductor wafer processed according to conventional semiconductor manufacturing techniques and in accordance with the present invention to produce a field effect transistor having an asymmetrical channel profile. In another embodiment, the semiconductor substrate 108 may be a portion of an integrated circuit which includes the semiconductor substrate 108 and the plurality of field effect transistors such as the illustrated transistor 100 formed in the semiconductor substrate 108. In such an embodiment, at least one field effect transistor of the plurality of field effect transistors has an asymmetrical channel doping profile. Not all structures necessary to form the field effect transistor 100 are illustrated in FIG. 1. For example, metal regions necessary to form contacts to source and drain regions are not illustrated. The semiconductor substrate 108 is preferably silicon, but other semiconductors or compound materials may be used.

The source region 104 and the drain region 106 are formed by defining active semiconductor regions in areas of field oxide formed on the surface 114 of the semiconductor substrate 108. Using known ion implantation processes, the source region 104 and the drain region 106 (collectively referred to herein as source/drain regions) are doped to be p-type material performing a p-channel field effect transistor or n-type material to form n-channel field effect transistors. The source region 104 includes a source 116, a source extension 118 and a source side halo 120. The drain region 106 includes a drain 122 and a drain extension 124.

The gate stack 102 includes an insulating layer 110 and a gate 112. The insulator 110 is usually a very thin layer of silicon dioxide. The gate 112 is formed from conductive layers such as polysilicon. The gate oxide 110 and the gate 112 are formed using conventional semiconductor processing techniques, such as deposition of a layer of material on the entire surface of a silicon wafer and photolithography to pattern, etch and thereby define the specific shapes of the gate oxide 110 and the gate 112.

Forming the gate stack 102 on the surface 114 of the semiconductor substrate 108 defines a channel region 130 under the gate stack 102. The channel region 130 is positioned between the source region 104 and the drain region 106. As is well understood by those ordinarily skilled in the art, during operation of the field effect transistor 100, the channel region 130 becomes electrically conducting to permit current to flow between the source region 104 and the drain region 106. The channel region 130 has one end 132 proximate a first source/drain, source region 104, and another end 134 proximate a second source/drain region, the drain region 106.

FIG. 1 further illustrates the relative doping profile of regions of the field effect transistor 100. On this plot, the horizontal axis shows relative distance along the cross-sectional view of the field effect transistor 100 and the vertical axis illustrates the log net doping of the various regions of the field effect transistor 100.

As can be seen in FIG. 1, the source 116 and the drain 122 have relatively constant doping levels at a doping concentration 140. Closer to the channel region 130, the source extension 118 and the drain extension 124 also have constant but lower doping levels than that of doping concentration 142. In these identified regions, the source 116, the source extension 118, the drain 122 and the drain 124, the implanted doping ions are all of the same type. Thus, if the field effect transistor 100 is an n-channel transistor, the doping ions in these identified regions are all n-type dopant, such as phosphorous or arsenic. Conversely, if the field effect transistor 100 is a p-channel transistor, the dopant in these identified regions is p-type dopant such as boron. In contrast, the doping in the channel region 130 and in the source side halo 120 is of a complimentary type. Thus, if the field effect transistor 100 is an n-channel doping in the channel region 130 and source side halo 120 is p-type. Similarly, if the field effect transistor 100 is a p-channel transistor, doping in the channel region 130 and the source side halo 120 is n-type.

Thus, in the log net doping plot of FIG. 1, the net doping changes sign at point 144 and point 146. However, because the plot shows log net doping, the sign change is not evident.

As can further be seen in the plot of FIG. 1, the source side halo 120 has a doping level which decreases from a maximum value 144 to a minimum value 146. Thus, the total doping in the channel region 130 is graded from a maximum value 144 to a minimum value 148. Thus, by including the source side halo 120, the field effect transistor 100 has an asymmetrically doped channel region 130. This is in contrast with previous field effect transistors in which the doping profile was symmetrical about a line drawn vertically in FIG. 1 through the center of the gate stack 102 and the center of the channel region 130. In accordance with the present invention, the asymmetrical doping of the field effect transistor 100 is achieved by implanting dopant at a predetermined tilt angle and rotation angle to dope a portion of the channel region 130 proximate the source region 104.

Figure 2:
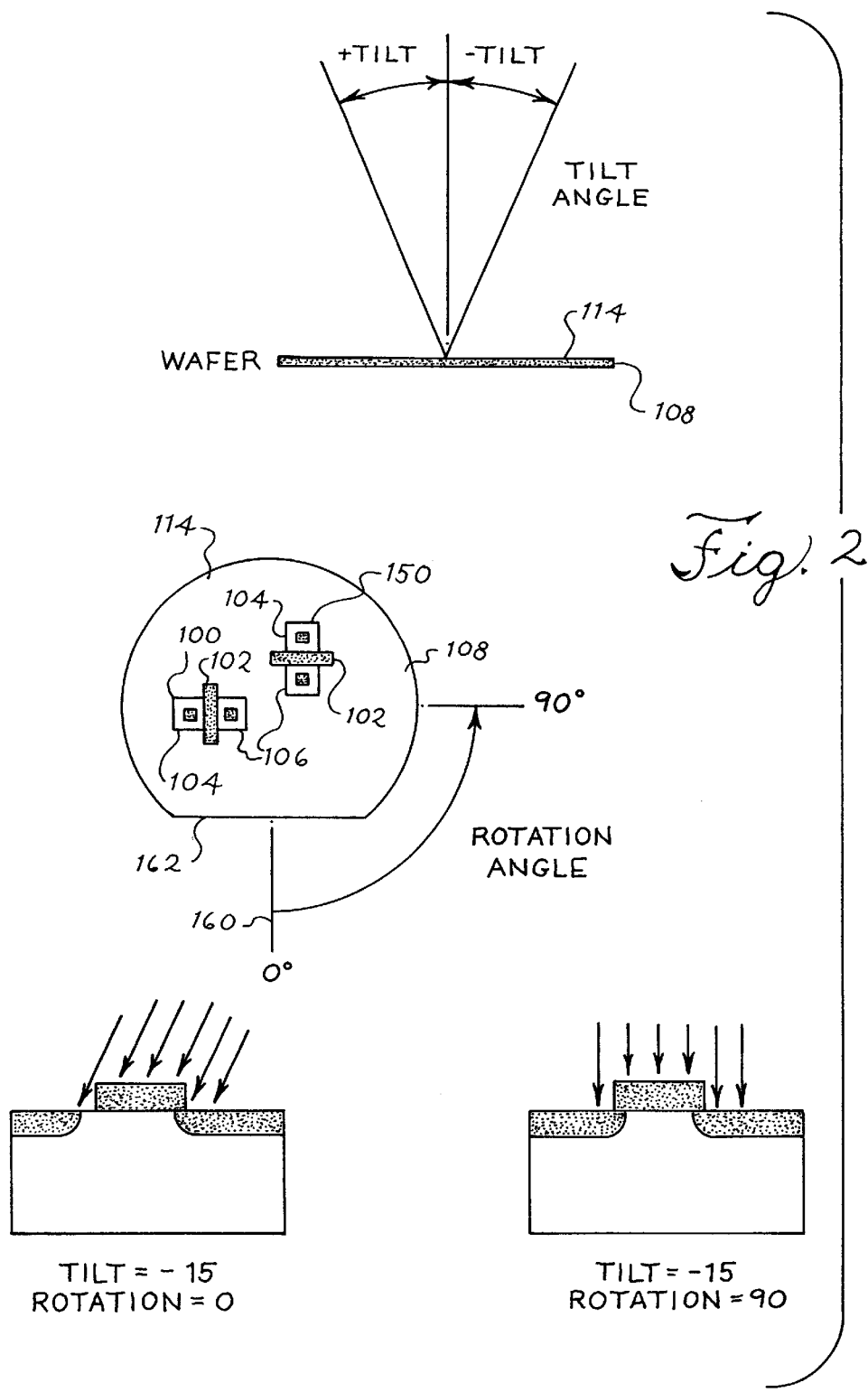
FIG. 2 is a series of diagrams showing tilt angle and rotation angle as used in the present application.

FIG. 2 illustrates tilt angle and rotation angle as used in the context of the present invention. The tilt angle and the rotation angle define the orientation with which doping ions are implanted in a semiconductor substrate. In this illustration, the semiconductor substrate 108 is a silicon wafer having a flat 162 on one edge. The flat 162 is defined in relation to the crystal orientation of the silicon.

In the first diagram of FIG. 2, the tilt angle is defined in relation to the surface 114 of the semiconductor substrate 108. A zero degree tilt angle is normal to the surface 114. A positive tilt and a negative tilt are defined as illustrated in the figure. In the second diagram of FIG. 2, the rotation angle is defined relative to a line 160 taken normal to the flat 162 of the wafer forming the substrate 108. As is shown in this diagram, field effect transistors 100 and 150 are formed on the surface 114 of the semiconductor substrate 108. Each of the transistors 100, 150 includes a gate stack 102, a source region 104 and a drain region 106. The transistor 150 is oriented at a 90° angle relative to the transistor 100. In conventional semiconductor processing technology, transistor orientations are limited to the two orientations shown in FIG. 2. The remaining diagrams in FIG. 2 illustrate two examples of tilt angle and rotation angle.

Figure 3:
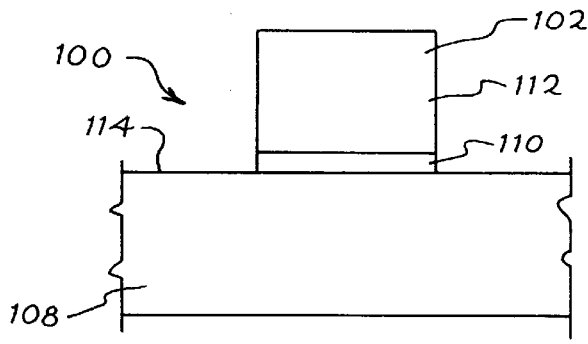
FIG. 3 through FIG. 7 are cross-sectional views illustrating steps in the manufacture of a field effect transistor in accordance with the present invention.
Figure 4:
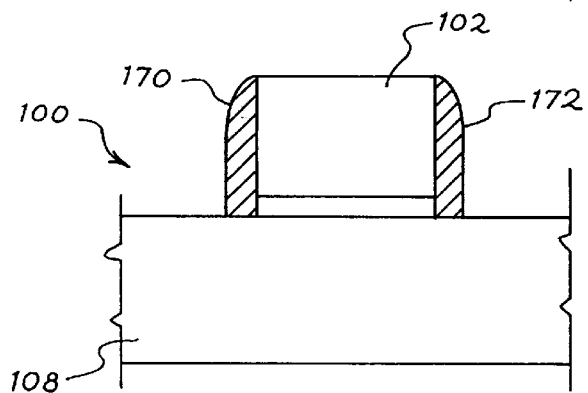

FIG. 3 through FIG. 7 illustrate steps in the manufacture of the field effect transistor 100. In FIG. 3, the gate stack 102 has been defined on the surface 114 of the semiconductor substrate 108. The gate stack 102 includes the gate dielectric or insulator 110 and the gate 112. The gate dielectric 110 and the gate 112 are formed by depositing appropriate layers on the surface 114 of the semiconductor substrate 108, patterning and etching in accordance with conventional semiconductor processing techniques. FIG. 4 illustrates a subsequent step in the manufacture of the field effect transistor 100. In FIG. 4, spacers 170 and 172 have been defined on the sides of the gate stack 102. The spacers 170, 172 may be formed of silicon dioxide or silicon nitride or any other suitable material. The spacers 170, 172 are conventionally formed using deposition and etching processes.

Figure 5:
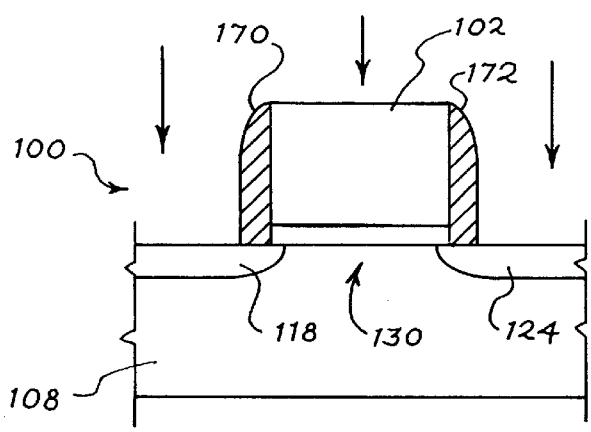

FIG. 5 illustrates a next step in the manufacture of the field effect transistor 100. The illustrated step is conventionally referred to as the lightly doped drain or LDD implant. The LDD implant forms the source extension 118 and the drain extension 124. These extension regions are relatively lightly doped, as was illustrated in the log net doping profile of FIG. 1. The gate stack 102 blocks the implanted ions from the channel region 130 so that substantially no ions are implanted in the channel region 130. The implant tilt angle and rotation angle are illustrated by the arrows in FIG. 5.

Figure 6:
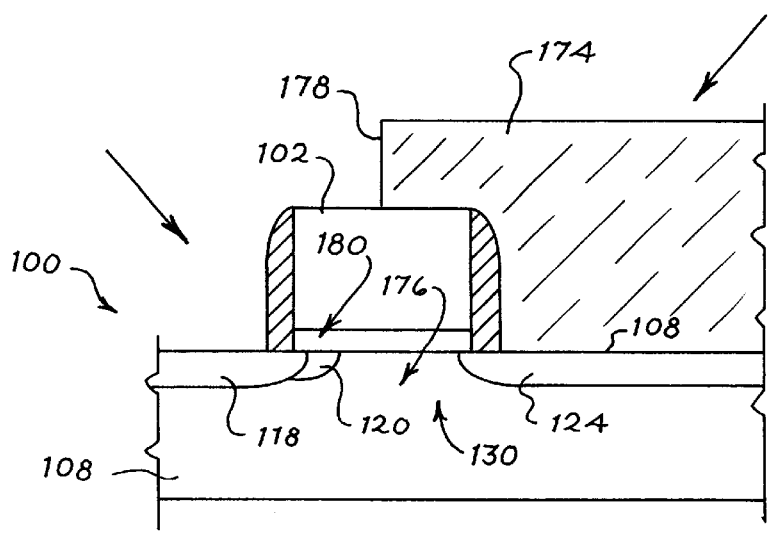

FIG. 6 illustrates a next step in the manufacture of the field effect transistor 100. In FIG. 6, a masking layer 174 has been formed on the surface 114 of the semiconductor substrate 108. The masking layer is used to block implantation of ions during the asymmetric channel implant step illustrated in FIG. 6. The masking layer 174 is typically photoresist but may be any suitable layer. During the asymmetric channel implant step of FIG. 6, the masking layer 174 masks one end 176 of the channel region 130 associated with the gate stack 102. However, because of the positioning of the edge 178 of the masking layer 174, the other end 180 of the channel region 130 is not masked. The other end 180 of the channel region 130 is therefore exposed to the asymmetric channel implant. During the asymmetric channel implant step, doping ions of the same type as the doping of the channel region 130 are implanted at the end 180 of the channel region 130, as well as other exposed regions of the semiconductor substrate, such as the source extension 118. The effect of this implant is to increase channel doping at the source end 180 of the channel region 130, forming the source side halo 120. The asymmetric channel implant is a relatively light implant, as illustrated in the log net doping profile of FIG. 1. The net effect of the implant in the source extension 118 is insignificant. Also, the source extension 118 is of a complementary doping type to the source side halo 120. Resulting doping in the source extension 118 is largely unchanged after the asymmetric channel implant.

In the illustrated embodiment, the asymmetric channel mask and implant occur after the formation of the spacers 170 and 172 and the LDD implant. In alternative embodiments, the asymmetric channel mask and implant steps can occur before spacer formation and LDD implant with similar structural and operational benefits.

Following the implants, the semiconductor substrate 108 may be heated in a furnace in an anneal step to heal imperfections in the crystal lattice of the semiconductor substrate 108 and to activate the implanted ions in the source side halo 120. This anneal step also produces some out-diffusion of the dopant in the source side halo.

Figure 7:
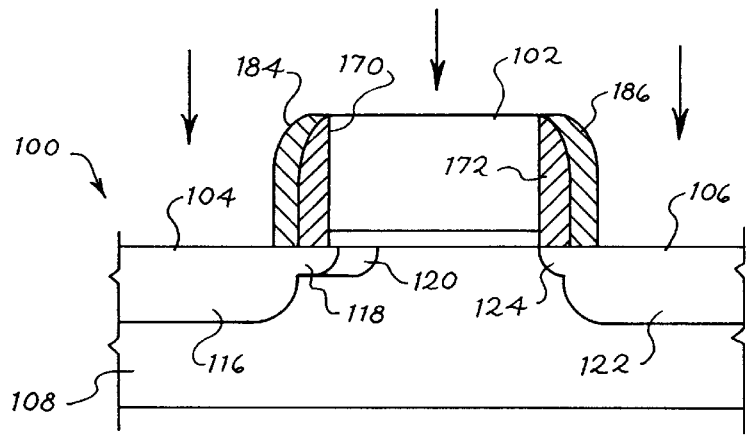

FIG. 7 illustrates a subsequent step in the manufacture of the field effect transistor 100. In FIG. 7, second spacers 184 and 186 have been formed on the sides of the gate stack 102. Following definition of the second spacers 184, 186, the source/drain implant occurs to define the source 116 and the drain 122. This is a relatively heavy implant, as is illustrated in the log net doping profile of FIG. 1, and doping ions are implanted relatively deeply to form the source 116 and the drain 122. In subsequent steps following that illustrated in FIG. 7, metalization and other layers are formed on the semiconductor substrate 108.

Figure 8:
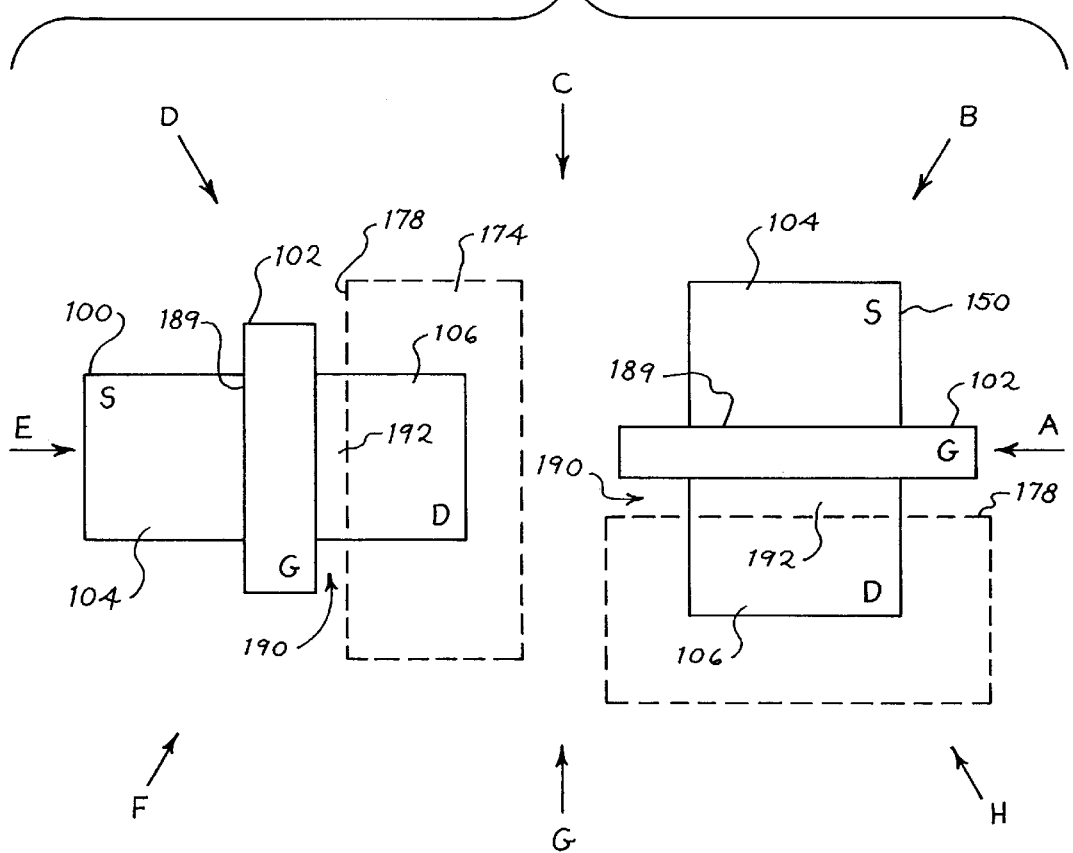
FIG. 8 is a top plan view of transistor devices in different orientations on a semiconductor substrate.

FIG. 8 illustrates a top plan view of a field effect transistor 100 and a field transistor 150 formed on a semiconductor substrate. The field effect transistor 100 and the field effect transistor 150 each includes a gate stack 102 which defines a source region 104 and a drain region 106 on either side of the gate stack 102. A masking layer 174 is formed on a surface semiconductor substrate to mask one end of the channel region associated with each gate stack 102. This permits implantation of ions at the other end of the channel regions associated with each gate stack 102 to asymmetrically dope the field effect transistor 100 and the field effect transistor 150. Preferably, the masking layers 174 are defined using a single mask for all transistor orientations of a given transistor type. That is, the same mask defining the masking layer 174 is used for all n-channel transistors, including field effect transistor 100 at its illustrated orientation and the field effect transistor 150 at its illustrated orientation. If field effect transistor 100 is an n-channel transistor and field effect transistor 150 is a p-channel transistor, a separate mask will be used to define the masking layers for the two transistor types. This reduces the cost of manufacturing the field effect transistors.

The step of forming the masking layer 174 includes positioning the masking layer 174 at a nominal position with a maximum misalignment tolerance. For example, the nominal position of the masking layer 174 might be the position illustrated in FIG. 6, in which the edge 178 is generally centered over the gate stack 102. A different nominal position might place the edge 178 of the masking layer 174 in alignment with an edge 189 of the gate stack 102 at the source end of the gate stack 102.

The nominal position is the position at which the masking layer 174 is placed when no misalignment errors occur. The tolerance is the maximum misalignment which may occur to still produce a normally functioning field effect transistor. The maximum tolerance might be, for example, as illustrated in FIG. 8, in which the edge 178 of the masking layer is located over the drain region 106.

Locating the edge 178 over the drain 106 and not over the gate stack 102 defines a notch 190 between the edge 178 of the masking layer 174 and the gate stack 102. In this notch, a portion 192 of the drain region 106 is exposed and could possibly be exposed to the asymmetric channel implant. If the asymmetric channel implant occurs at the drain end of the transistor, the transistor will not function as intended. Similarly, if the masking layer 174 is misaligned so that the edge 178 extends over the source region 104, the asymmetric channel implant will not reach the end of the channel region closest to the source region 104 and the transistor will not function as intended. However, because of narrow geometric dimensions available in modem semiconductor processing technology, the required misalignment tolerance becomes very small. In effect, under the situation described above, the edge 178 would have to be maintained over the gate stack 102 to assure properly functioning transistors. In modem devices, the gate stack may have a gate length of less than 0.15 μm.

FIG. 8 illustrates several possible rotation angles for the asymmetric channel implant step. These rotation angles are designated A, B, C, D, E, F, G and H in FIG. 8. The asymmetric channel implant step also includes a specified tilt angle which is non-zero and suitable for implanting doping ions at the source end of the channel region of each transistor. One exemplary tilt angle is 45°. Other tilt angles may be suitably chosen.

In FIG. 8, if the rotation angle A is selected, the masking layer 174 will block implantation of doping ions in the notch 192 of the transistor 100. Even though the edge 178 of the masking layer 174 is spaced from the gate stack 102, because of the thickness of the masking layer 174 and the gate stack 102 above the surface of the semiconductor substrate, the implanted ions will be shadowed by the masking layer 174 for the transistor 100. However, for the transistor 150, the masking layer 174 and the gate stack 102 leave exposed the notch 192 so that no blocking or shadowing of the implanted ions occur. Thus, the rotation angle A will not be suitable for asymmetrically doping the field effect transistor 150.

Rotation angle E will have similar limitations. For transistor 100, the gate stack 102 shadows the exposed drain region 106 in the notch 192, to prevent ion implantation in the drain region. However, for the transistor 150, the drain region 106 in the notch 192 is exposed to the implanting ions. Thus, the rotation angle E will not be suitable for asymmetrically doping the field effect transistor 150.

If rotation angle C is selected, the gate stack 102 of transistor 150 will shadow the drain region 106 in the area of the notch 192. However, for the transistor 100, neither the gate stack 102 nor the masking layer 174 shadows or blocks the implanting ions from the drain region 106 in the region of the notch 192. Thus, the rotation angle C is not suitable for asymmetrically doping the field effect transistor 100. Similarly, the rotation angle G is not suitable for asymmetrically doping the field effect transistor 100, because the drain region 106 in the notch 192 of the transistor 100 is exposed.

In contrast, rotation angle B, rotation angle D, rotation angle F and rotation angle H are all suitable for asymmetrically doping both the field effect transistor 100 and the field effect transistor 150. At these selected rotation angles, either the gate stack 102 or the masking layer 174 blocks or shadows the drain region 106 in the notch 192 of both transistors 100, 150. This is true even in the maximum misalignment case illustrated in FIG. 8.

Thus, in accordance with the present invention, a method for asymmetrically doping a field effect transistor includes a step of implanting dopant at a predetermined rotation angle such as the rotation angle B, rotation angle D, rotation angle F and rotation angle H. In the illustrated embodiment, these rotation angles are located at multiples of 90° offset by multiples of 45° relative to the orientation of the transistors 100, 150. However, other suitable angles may be chosen. The specific rotation angle and tilt angle selected will depend on the thickness of the gate stack 102 and the masking layer 174 above the surface of the semiconductor substrate. These angles should be chosen to ensure shadowing or blocking of doping ions even under worse case misalignment conditions. In one embodiment, the asymmetric channel implant step uses all four rotation angles illustrated as being acceptable in FIG. 8. In an alternative embodiment, only the diametrically opposed angles are used. Thus, in this alternative embodiment, only rotation angle D and rotation angle H would be used or only rotation angle B and rotation angle F would be used for the asymmetric channel implant step. This embodiment may slightly reduce manufacturing costs.

From the foregoing, it can be seen that the present invention provides an improved method for manufacturing field effect transistor devices. A gate stack is formed on the surface of a semiconductor substrate. A masking layer is formed on the surface of the semiconductor substrate, preferably using a single mask for all transistor orientations of a given transistor type. The masking layer masks one end of the channel region of the transistors. Ions are implanted at the other, non-masked end of the channel regions to asymmetrically dope field effect transistors. Doping implantation tilt and rotation angles are selected which are sufficient to ensure shadowing of the masked end of the channel region from implantation of the doping ions when the masking layer is positioned within its misalignment tolerance. In this manner, only one asymmetric channel doping masking step is required for all orientations of transistors of a given type, such as n-channel of p-channel transistors. Thus, the present invention provides a method for creating asymmetric channel profiles which minimizes additional manufacturing costs.

While a particular embodiment of the present invention has been shown and described, modifications may be made. It is therefore intended in the appended claims to cover all such changes and modifications which fall within the true spirit and scope of the invention.

We claim:

1. A method for manufacturing a field effect transistor, the method comprising:

forming a gate stack on the surface of a semiconductor substrate to define source/drain regions on either side of the gate stack and a channel region under the gate stack, the channel region having one end proximate a first source/drain region and another end proximate a second source/drain region;

forming a masking layer on the surface of the semiconductor substrate, the masking layer having a nominal alignment position and a misalignment tolerance; and implanting doping ions in the semiconductor substrate to asymmetrically dope the field effect transistor, including:

selecting a tilt angle and a rotation angle sufficient to ensure shadowing of one end of the channel region from implantation of the doping ions when the masking layer is positioned within the misalignment tolerance;

wherein forming a masking layer comprises using a single mask to define the masking layer without respect to orientation of the field effect transistor on the semiconductor substrate.

2. A method as recited in claim 1 wherein the nominal alignment position of the masking layer is spaced by the misalignment tolerance from an edge of the gate stack adjacent to the first source/drain region.

3. A method as recited in claim 1 wherein implanting comprises selecting a plurality of rotations at angles spaced 45° from a first axis aligned with the gate stack and a second axis perpendicular to the first axis.

4. A method as recited in claim 1 further comprising forming source/drain regions by:

lightly doping the semiconductor substrate using the gate stack as a mask; and doping the semiconductor substrate using the gate stack and side walls as a mask.

5. A method for manufacturing a field effect transistor, the method comprising:

forming a gate stack on the surface of a semiconductor substrate to define source/drain regions on either side of the gate stack and a channel region under the gate stack, the channel region having one end proximate a first source/drain region and another end proximate a second source/drain region;

forming a masking layer on the surface of the semiconductor substrate, the masking layer having a nominal alignment position and a misalignment tolerance; and implanting doping ions in the semiconductor substrate to asymmetrically dope the field effect transistor, including:

selecting a tilt angle and a rotation angle sufficient to ensure shadowing of one end of the channel region from implantation of the doping ions when the masking layer is positioned within the misalignment tolerance;

wherein implanting comprises selecting a plurality of rotations at angles spaced 45° from a first axis aligned with the gate stack and a second axis perpendicular to the first axis.

6. A method as recited in claim 5 wherein forming a masking layer comprises using a single mask to define the masking layer without respect to orientation of the field effect transistor on the semiconductor substrate.

7. A method as recited in claim 5 wherein the nominal alignment position of the masking layer is spaced by the misalignment tolerance from an edge of the gate stack adjacent to the first source/drain region.

8. A method as recited in claim 5 further comprising forming source/drain regions by:

lightly doping the semiconductor substrate using the gate stack as a mask; and doping the semiconductor substrate using the gate stack and side walls as a mask.

* * * * *

UNITED STATES PATENT AND TRADEMARK OFFICE
CERTIFICATE OF CORRECTION

PATENT NO. : 6,242,329 B1
DATED : June 5, 2001
INVENTOR(S) : Carl Robert Huster, Concetta Riccobene, Richard Rouse, Donald L. Wollesen It is certified that error appears in the above-identified patent and that said Letters Patent is hereby corrected as shown below:

Column 1,
Line 24, please replace the word "(loping" with -- doping --.

Column 6,
Line 2, please replace the word "modem" with -- modern --.
Line 7, please replace the word "modem" with -- modern --.

Column 7, and Column 8,
Line 57, to Line 1, please replace the phrase "without respect to orientation" with -- for all possible orientations --.

Column 8,
Line 45, please replace the phrase "without respect to orientation" with -- for all possible orientations --.

Signed and Sealed this

Twenty-fifth Day of December, 2001

Attest:

JAMES E. ROGAN
*Attesting Officer*   *Director of the United States Patent and Trademark Office*